US006795889B2

(12) United States Patent
Berg et al.

(10) Patent No.: US 6,795,889 B2
(45) Date of Patent: Sep. 21, 2004

(54) METHOD AND APPARATUS FOR MULTI-PATH DATA STORAGE AND RETRIEVAL

(75) Inventors: Thomas B. Berg, Portland, OR (US); Wayne A. Downer, Portland, OR (US); Thomas E. Kloos, Portland, OR (US); Richard L. Stout, Tualatin, OR (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 10/045,797

(22) Filed: Jan. 9, 2002

(65) Prior Publication Data

US 2003/0135698 A1 Jul. 17, 2003

(51) Int. Cl.[7] .............................................. G06F 12/00
(52) U.S. Cl. ..................... 711/5; 711/154; 714/763; 365/189.02
(58) Field of Search ................. 711/147, 154–155, 711/4–5, 105; 714/6, 763; 710/310; 365/189.01

(56) References Cited

U.S. PATENT DOCUMENTS

| | | | |
|---|---|---|---|
| 4,835,738 A | | 5/1989 | Niehaus et al. |
| 5,115,411 A | * | 5/1992 | Kass et al. ............. 365/189.01 |
| 5,261,057 A | * | 11/1993 | Coyle et al. ................ 710/310 |
| 5,313,624 A | | 5/1994 | Harriman et al. |
| 5,446,845 A | | 8/1995 | Arroyo et al. |
| 5,600,808 A | | 2/1997 | Kasukawa |
| 5,719,998 A | | 2/1998 | Ku et al. |
| 5,886,930 A | | 3/1999 | Maclellan et al. |
| 6,011,727 A | | 1/2000 | Merritt et al. |
| 6,029,224 A | | 2/2000 | Asthana et al. |
| 6,065,091 A | | 5/2000 | Green |
| 6,564,306 B2 | * | 5/2003 | Dugan et al. ............... 711/155 |

* cited by examiner

Primary Examiner—Nasser Moazzami
(74) Attorney, Agent, or Firm—Law Offices of Michael Drysa

(57) ABSTRACT

A means and method to receive and store a continuous flow of data items being processed in a data processing system in which data items are received from multiple sources simultaneously. The invention provided for simultaneous retrieval of previously stored data from multiple destinations while providing low latency of the retrieved data. The invention utilizes multi-port random access memory or register arrays with fewer ports than the number of actual data sources or data destinations within the system. The disclosure teaches a means of providing the control of data flow to multi-port simultaneous access memory systems, utilizing the control paths in the memory control systems rather than the data paths in such systems. The system eliminates or reduces the need for memory buffers to manage data flow into or out of system memory devices which have a limited number of ports or paths connecting system memory to the input and output systems of the data processing system.

24 Claims, 12 Drawing Sheets

METHOD AND APPARATUS FOR MULTI-PATH DATA STORAGE AND RETRIEVAL

CROSS-REFERENCE TO RELATED APPLICATIONS

U.S. patent application Ser. No. 10/045,798 by T. B. Berg et al. (BEA919990003US1) entitled "Method And Apparatus For Increasing Requestor Throughput By Using Data Available Withholding" was filed on Jan. 9, 2002.

U.S. patent application Ser. No. 10/045,927 by T. B. Berg et al. (BEA920000017US1) entitled "Method And Apparatus For Using Global Snooping To Provide Cache Coherence To Distributed Computer Nodes In A Single Coherent System" was filed on Jan. 9, 2002.

U.S. patent application Ser. No. 10/045,821 by T. B. Berg et al. (BEA920000018US1) entitled "Multi-level Classification Method For Transaction Address Conflicts For Ensuring Efficient Ordering In A Two-level Snoopy Cache Architecture" was filed on Jan. 2, 2002.

U.S. patent application Ser. No. 10/045,564 by S. G. Lloyd et al. (BEA920000019US1) entitled "Transaction Redirection Mechanism For Handling Late Specification Changes and Design Errors" was filed on Jan. 9, 2002.

U.S. patent application Ser. No. 10/045,923 by W. A Downer et al. (BEA920000021US1) entitled "Hardware Support For Partitioning A Multiprocessor System To Allow Distinct Operating Systems" was filed on Jan. 9, 2002.

U.S. patent application Ser. No. 10/045,925 by T. B. Berg et al. (BEA920000022US1) entitled "Distributed Allocation Of System Hardware Resources For Multiprocessor Systems" was filed on Jan. 9, 2002.

U.S. patent application Ser. No. 10/045,926 by W. A. Downer et al. (BEA920010030US1) entitled "Masterless Building Block Binding To Partitions" was filed on Jan. 9, 2002.

U.S. patent application Ser. No. 10/045,774 by W. A. Downer et al. (BEA920010031US1) entitled "Building Block Removal From Partitions" was filed on Jan. 9, 2002.

U.S. patent application Ser. No. 10/045,796 by W. A. Downer et al. (BEA920010041US1) entitled "Masterless Building Block Binding To Partitions Using Identifiers And Indicators" was filed on Jan. 9, 2002.

BACKGROUND OF THE INVENTION

1. Technical Field

The present invention relates to computer system memory management utilizing multiplexed input and output of data to system memory to provide for high speed data throughput, and more particularly to reducing delay or system latency by eliminating the need for data buffering devices or systems to handle the throughput of data into and out of system memory.

2. Description of the Related Art

A typical computer system consists of a number of modules or components. Computer systems typically include a central processing unit (CPU) such as a microprocessor which functions with memory storage components to interface with both one or more CPU's and a variety of input output (I/O) components for connecting external devices to the microprocessor which provide data for processing by the system. These storage components may be read only memory (ROM), random access memory (RAM) most typically used for system memory, or any other suitable storage means. A computer system typically also includes special purpose components, such as memory management units, co-processors, and other ancillary subsystems used to enhance the operation of the main system components as part of the computer system. The memory component of a computer system, also known as "main memory," is a system resource that is dynamically allocated to programs or processes. Main memory is typically dynamic random access memory (DRAM), or synchronous dynamic random access memory (SDRAM). Processor main memory is usually "byte" organized. That is, memory is arranged as a sequence of 8-bit bytes and the byte is the smallest unit of information accessed out of the memory. In early conventions, an entire row is selected by a row address and columns and accessed in groups of 8 bits. In current design implementations, 64-bit or 128-bit words are accessed at one time in terms of memory management Utilizing commonly applied error correction coding (ECC) of eight additional bits to a 64-bit data word or line, memory storage and management designs are now using data lines of a total of 144-bits (two 64-bit words) in handling system operations within a processor or multiprocessor system. The invention disclosed most particularly relates to microprocessor computer system cache memory or memory subsystems which utilize registers for short-term storage of information necessary to operate within the system as a whole.

Much of the prior art in the field of computer system memory management addresses how to maximize the data throughput, and increase processing speed, into and out of memory register arrays used in a variety of different computer systems. U.S. Pat. No. 5,313,624 issued to Harriman describes the use of a multiplexor to route data to one of four memory arrays. U.S. Pat. No. 4,835,738 issued to Niehaus discloses a computer memory array interfaced to a data register through a multiplexor. While these references teach the use of computer architecture and logic design to allow continuous data flow to multiple paths simultaneously, they do not teach the multiplexing function that distributes data to several different memory array portions of a devices total memory with continuous data flow.

SUMMARY OF THE INVENTION

The present invention provides a method and apparatus for avoiding the complexity of random access memory (RAM) with eight input and/or output ports by utilizing a multiplexing method to reduce the number of required ports to two while maintaining throughput speed and path accessability to all memory arrays provided in the computer system. A logic structure which can receive and store a continuous flow of data items from multiple data paths simultaneously is disclosed. The structure permits low latency simultaneous retrieval of previously stored data items by multiple destinations.

A system of the invention utilizes two or more memory registers in the form of register arrays coupled to a first multiplexor for receiving data from a data source such as a microprocessor coupled to said memory registers. A second multiplexor is coupled to the memory registers for outputting data from the memory registers to the system. The registers are configured as slices of arrays, each slice having two independent inputs coupled to the first multiplexor to receive data input Each slice has two independent outputs to convey data to the second multiplexor. The system includes means to track the identification and location of data being stored to the registers from the first multiplexor as well as means to select identified data within the register arrays to allow output of the data to the second multiplexor in a controlled manner.

The invention also provides a method of handling data between a central processing unit (CPU) and a data storage means in which the data storage means receives and stores a continuous flow of data items being processed in the CPU in which data items are received from multiple sources simultaneously comprised of a plurality of memory registers configured into an array of slices of memory, each slice having two input ports coupled to an input multiplexor means and two output ports coupled to an output multiplexor means. The method: provides data words from a CPU to a first multiplexor interface coupled to the CPU and memory; identifies and tracks each of the data words; stores the data words sequentially in each slice of memory and storing the location and identification of each data word stored; and then outputs the data words to a destination requested by the CPU by identifying and selecting the slice containing the start of the requested data and sequentially reading the data words requested.

Apparatus of the invention comprises first and second memories, each having an input for writing data into the memory and an output for reading the data from the memory. A first input multiplexor has multiple system inputs for receiving the data, and an output coupled to the input of the first memory. Similarly a second input multiplexor has multiple system inputs for receiving the data simultaneously with the first input multiplexors receiving the data, and an output coupled to the input of the second memory. An output multiplexor has inputs coupled to the outputs of the first and second memories. An input controller identifies and locates the data in the memories, and an output controller coupled to the output multiplexor responds to that identification and location of the data.

Other features and advantages of the invention will become apparent from the following detailed description of the presently preferred embodiment of the invention, taken in conjunction with the accompanying drawings.

DETAILED DESCRIPTION OF THE PREFERRED EMBODIMENT

Overview and Technical Background

Figure 1A:
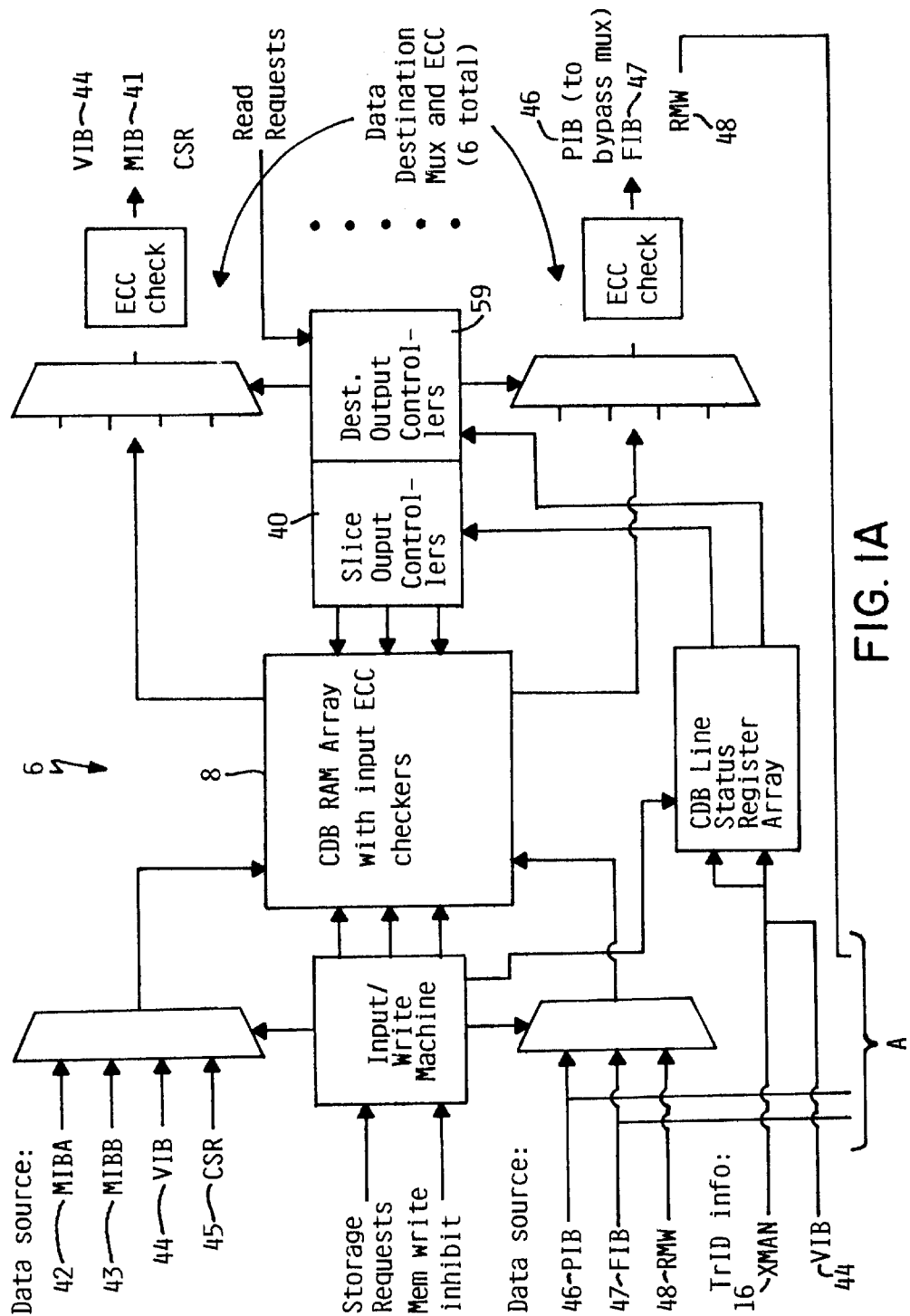
FIGS. 1A and 1B are a functional block diagram providing an overview of the data input and output architecture surrounding the memory registers in accordance with the present invention.

The invention includes a logic structure associated with a computer memory system utilizing a multiplexor device to distribute data from the input ports to several memory array portions of the computer system's total memory system whereby any given data source within the computer system is always feeding the input port of one portion of the memory arrays within the computer system. In the preferred embodiment, the system is implemented by using compact, multi-port random access memory (RAM) or memory register arrays with significantly fewer ports than the actual data sources or destinations being served. This allows handling the complexity of multi-port simultaneous access memories from the actual data paths into such memories to manipulation of the control paths for such data being simultaneously accessed. The register array disclosed is most frequently used as cache memory or temporary cache line storage, as opposed to random access memory used as main system memory.

In the preferred embodiment, data to be stored is organized as multiple 144-bit wide words of data. Such 144-bit wide words of data move along a data path usually at the rate of 1 word per system clock cycle. A group of four sequential 144-bit words makes up one full unit of memory storage referred to as a cache line. A cache line may also be described as one line in the embodiment presented, and is comprised of four data words.

The storage elements in the preferred embodiment are made up of multi-port register arrays (RA). Each RA is comprised of a 72-bit wide data line, is 64 words deep, and has 2 read and 2 write ports associated with each RA. A pair of RA's provides the storage necessary for a complete 144-bit wide word of data. The present embodiment utilizes two separate interconnected RA's to make up one 144-bit word because of limitations in the hardware available, but it should be appreciated that a 144-bit wide memory array could be utilized to provide the same results as that described herein.

For the purpose of the disclosure, a pair of RA's which is one 144-bit word by 64-entries deep shall be referred to as a slice, and a complete data storage area is composed of four slices. For each of the four slices of memory area, there are two input ports for each slice, providing a total of eight input sources to be accommodated at any one time. In the embodiment described, there is an input source for each 144-bit wide slice. Each input port is connected to a multiplexor that selects one of the four inputs to apply to a slice input port. The multiplexor controls are driven so that any given data source is always feeding the write port of one slice. The multiplexor control inputs change on each clock cycle of the system, thereby selecting the next multiplexor input to the RA. This operation distributes sequential 144-bit words on each input to each of the four slices and stores them in a RA location corresponding to an address provided at the write port.

In the present embodiment, one unit of storage, a memory cache line, is spread across all four slices at the same RA address. Each data source is always connected to a slice allowing data to be stored at any time without access conflicts from other sources. The multiplexors are scanning the data sources continuously, regardless of whether any data transfers are actually taking place. Control of the RA write enables determines whether data is actually stored.

Since data from any source within the system may start arriving to the memory at any time, the slice into which the first 144-bit word of a line is placed is not determined in advance. To allow for data to be read from storage in the same order in which it arrives to the RA's, the starting slice for a given cache-line is saved in an auxiliary storage array. For the cases where the data is not a full cache-line, the length and other attributes of the data may also be saved in the auxiliary array for later use by the data destination.

The present embodiment facilitates receiving data from the array by locating the starting slice for the desired cache-line and then sequentially reading out each 144-bit word of data. In the embodiment disclosed, there are two output ports for each slice with up to eight possible destinations divided between them. Each side of the RA, or port, is completely independent from the other side and services four destinations for the data. While input to the storage array is conflict free, outputs cannot be unless a system is actually using RAM with eight output ports. The present embodiment avoids the need for eight output ports while maintaining low latency for accesses.

Two of the destination output ports are designed as high priority ports. An output controller is designed to give a high priority destination within the system data when the system requires it, with minimal and deterministic staring delays and no empty timing cycles within the data flow. The remaining three outputs on each side of the arrays are managed in a specific way to avoid deadlocks and to minimize access latency to the data when two system destinations simultaneously request a data sequence that starts in the same slice of a RA. Each output destination is managed by a system which makes requests of other systems that manage each output port on the slices.

Upon receiving a request from the system being served by the present embodiment to retrieve data for a destination, the following sequence of events takes place:

1. The location of the stating slice of the requested data item is looked up in auxiliary storage, and the destination multiplexor selects the resulting slice;
2. The system destination requiring the data requests use of a desired slice;
3. The slice output control mechanism grants access to the slice based on an algorithm defining priority of access;
4. One slice with data flows to the destination requiring the data; and
5. If more data remains, the next slice is requested by the destination requiring the data, and the process repeats from step 3 above until all such required data by the destination has been accessed.

Further, when multiple destinations require the same slice of data, the system grants access in the following order.

1. High priority output;
2. Previously sidelined output stream;
3. The previous slice's data transfer destination where previous equals (n−1) where N refers to the previous slice of data; and
4. A newly starting data transfer request other than a high priority request, selected from multiple requests, if any, utilizing a selection mechanism to allow distribution of priority in waiting requests.

If a transfer of data in progress (with the exception of a high priority request), must be preempted to satisfy the slice grant priority, the pending slice address is placed in a "sideline" register until the next system clock cycle. With the above, the system maximizes the data flow from and to all destinations requiring the use of the data within the system, while minimizing the logic required. Since the starting slice for stored data is relatively random, the chance of conflict for two destinations requesting the data at the same time is only 25% and the penalty is at most two system clock cycles if such a transfer is delayed because of a conflict. In the preferred embodiment, the high priority ports are selected so that delays which may be experienced by the other ports do not significantly affect system performance.

Details of the Preferred Embodiment

Figure 1B:
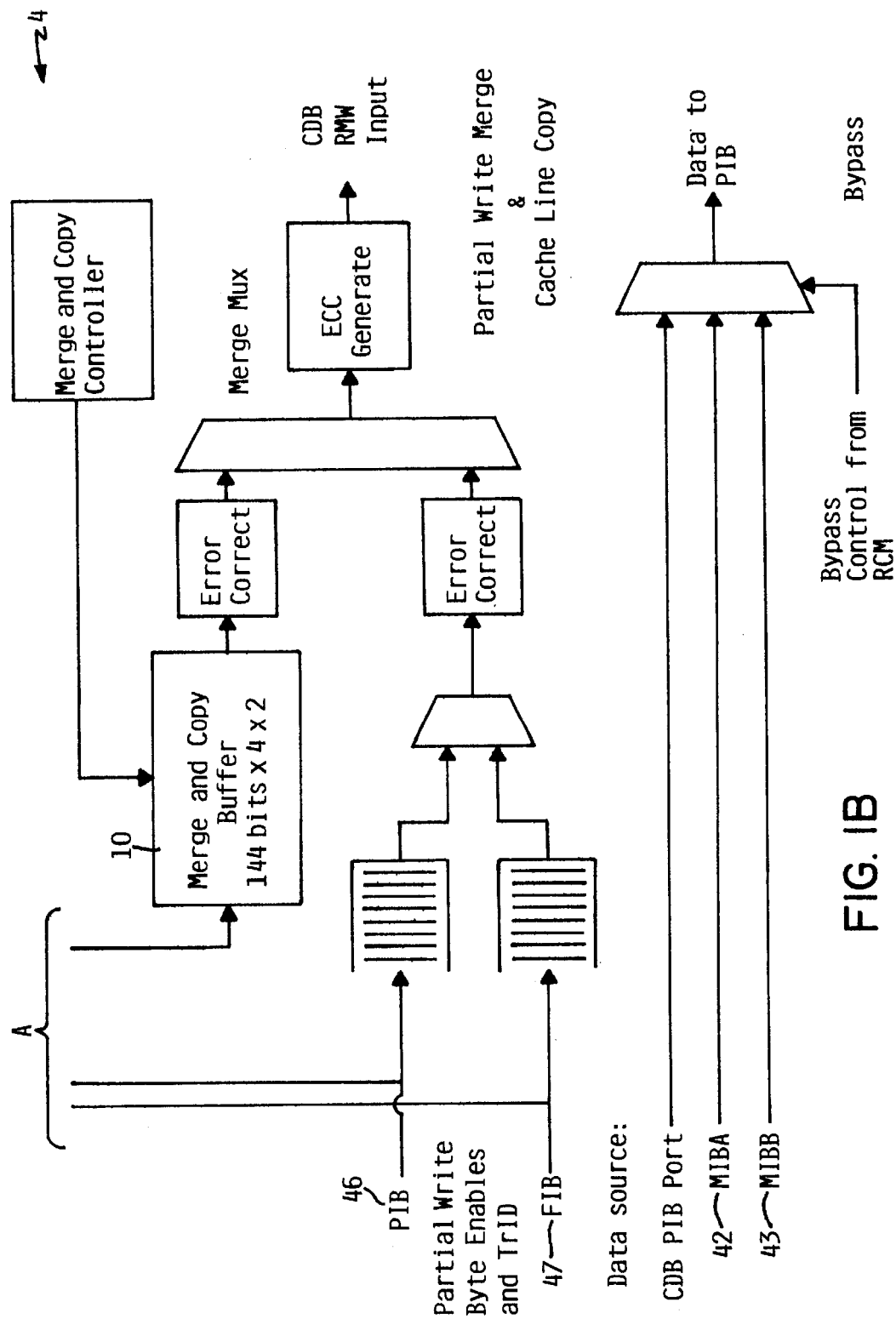

The preferred embodiment will now be described with reference to the various figures wherein like numerals relate to like parts or like signals. The data buffer system which comprises the preferred embodiment of the invention is used to facilitate the data flow through a data tagging and address crossbar system used to connect multiple processor groups in either a single quad or multiple quad processor system configurations. In such systems, there frequently is found control logic to interface with memory storage arrays systems utilizing random access memory (RAM) or other variations of system cache memory components, which supplement the main system data storage and retrieval systems. FIG. 1 (presented in two parts as FIGS. 1A and 1B for clarity, but representing one diagram), discloses a top level block diagram of a data organizer 4 (DOG) system employing the method of the presently preferred embodiment of the invention. DOG 4 provides data storage and routing between other computer system component subsystems in a multi-processor system. The heart of DOG 4 is a central data buffer 6 (CDB) in which contains a static random access memory array (SRAM) memory system comprised of an eight memory register array 8, each register providing memory for 64 different locations of 72 bit words of data as shown in more detail in FIG. 2. Surrounding the memory register array 8 is logic hardware that provides for no-wait writes into and low latency reads out of central data buffer 6 within DOG 4.

Figure 2:
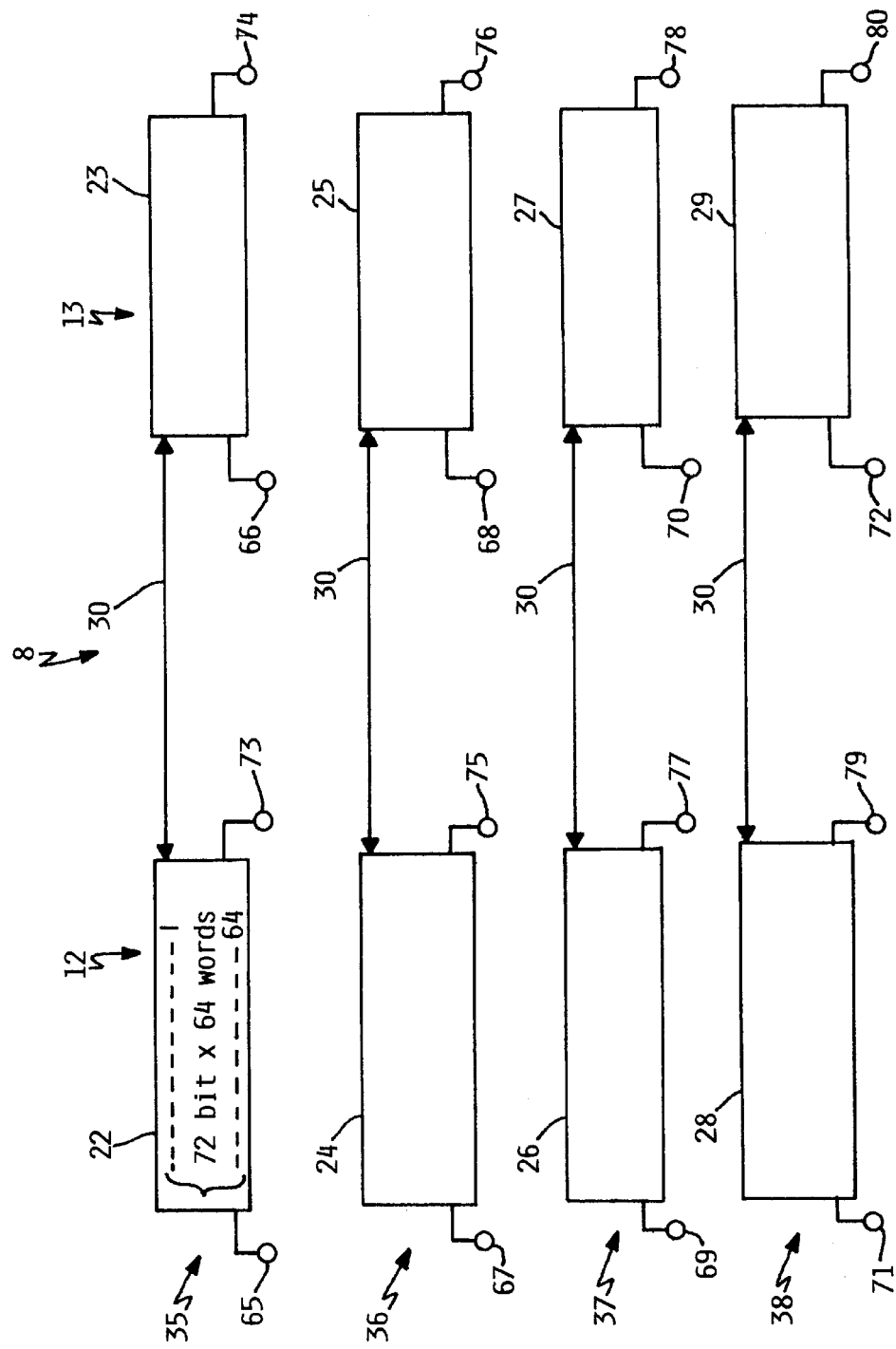
FIG. 2 is a functional block diagram of the configuration of the memory registers in accordance with the present invention.

CDB 6 within DOG 4 maintains data transaction identification information (TrID) identifying specific data for each cache line that is stored within its data buffer. Such information includes the starting slice, length, and several address bits. The length and address information is made available to other system components when they receive data from CDB 6 within DOG 4. Shown in FIG. 2, memory array 8 is comprised of eight register arrays 22–29. Each array is identical and it is composed of eight 64-word by 72-bit four port SRAM modules. As can be seen in FIG. 2, they are configured in pairs, and provide the storage necessary to hold 64 fill or partial cache lines of data made up of four 144-bit words. It could be appreciated by one skilled in the art that the memory modules are connected at 30 in order to provide twice the size capability of one particular static random access memory (SRAM) module.

Array 8 appears as four individual 64×144 SRAM's or slices, one for each of the four 144-bit words of a cache line. Because each SRAM module has four ports, being two read and two write ports, the four SRAM slices provide a total of eight independent data input paths, represented by register array inputs 65–72 in FIG. 2. The input control logic for CDB 6 allows all inputs to be used at the same time, although in the embodiment shown only seven of the inputs are needed Thus, data being provided by address and data cross-bar systems in a multiple processor computer device may stream data into CDB 6 without requirement of the data to wait.

The slices of data available from the array represented in FIG. 2 can also provide a total of eight independent data outputs, represented by register array outputs 73–80. Using all of the outputs at once is not usually practical in systems because the starting 144-bit word of each stored cache line is not necessarily in different slices. In the preferred embodiment, array 8 actually implements six outputs. With the exception of the merge and copy buffer 10, all other storage in DOG 4 utilize 144-bit wide registers used to pipeline all data being handled.

Figure 3A:
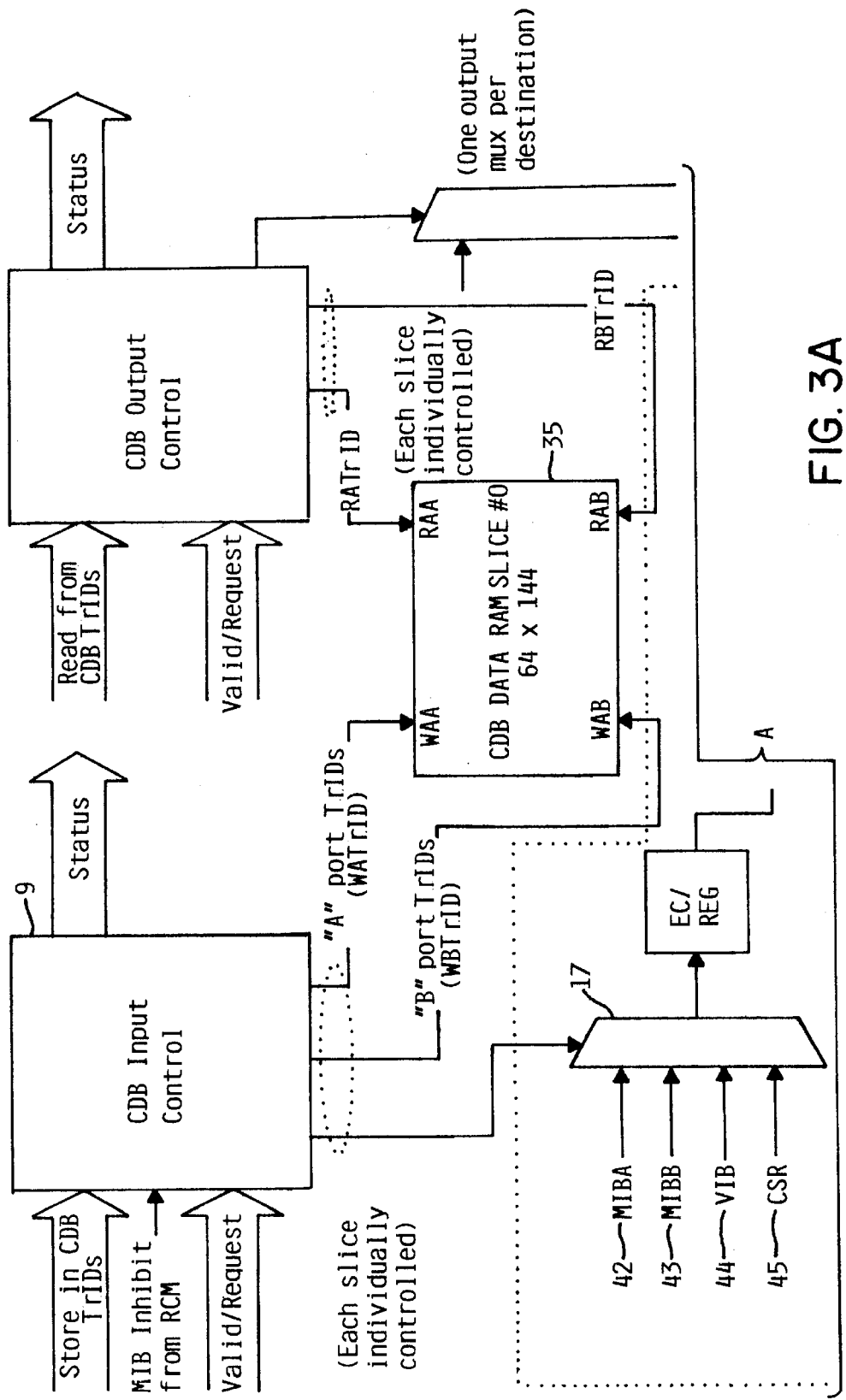
FIGS. 3A and 3B are a functional block diagram of the input and output control configurations used with the memory registers in accordance with the present invention, and is suggested for printing on the first page of the issued patent.
Figure 3B:
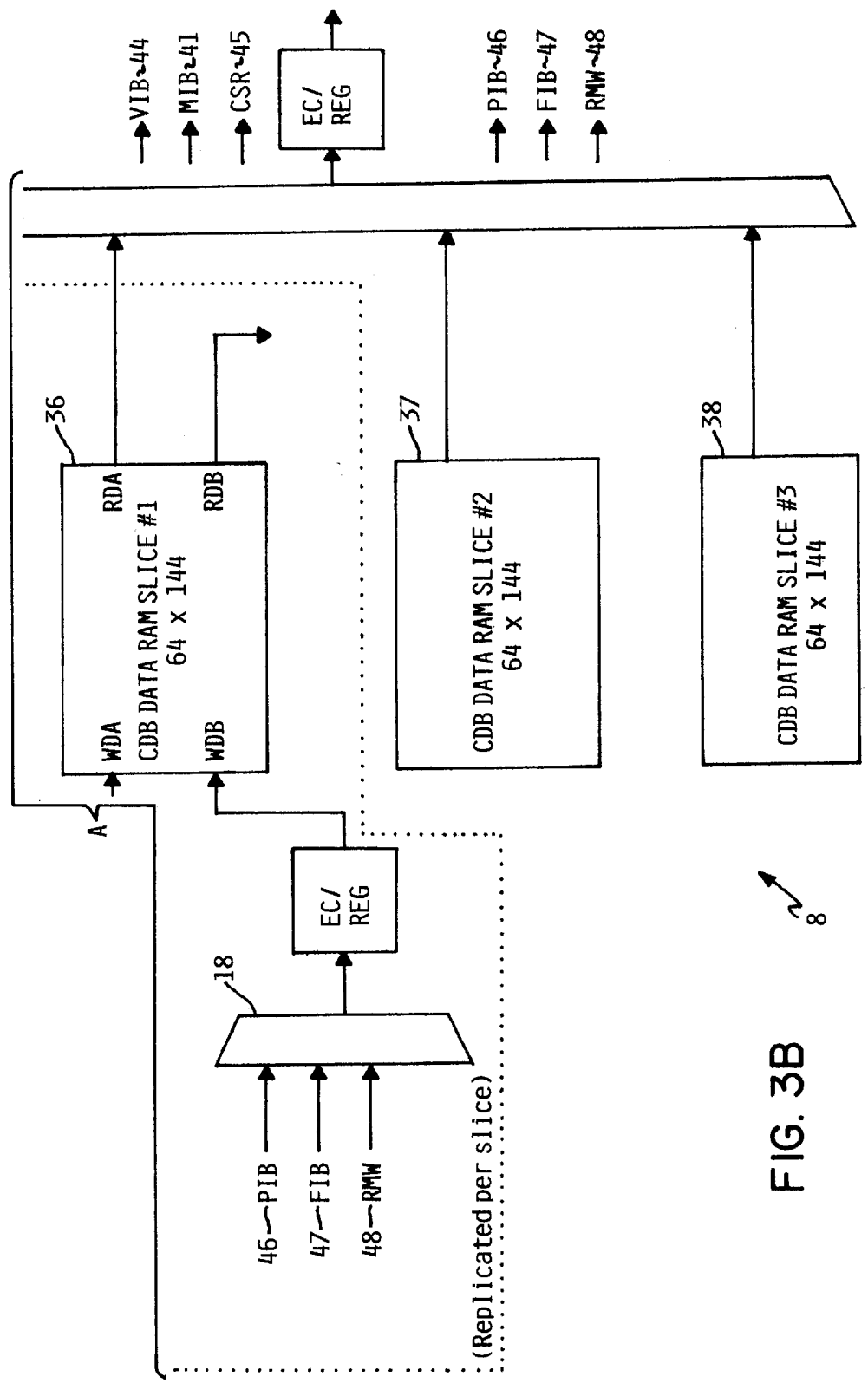

The 64-byte line data ordering within CDB 6 is straightforward Data ordering is maintained throughout the process in that the data that goes into CDB 6 is output in the same 72-bit or 144-bit data line order for the same TrID. If a data destination block requires an ordering different than what the data source provides, the destination block must do any reordering that is needed to continue processing any data through the system. The DOG 4 data input path consists of 144-bit wide four input multiplexors 17 and 18 on each write port of each of the four slices 35–38 shown on FIG. 3 (presented in two parts as FIGS. 3A and 3B for clarity, but representing one diagram). With four two input port slices (inputs 65 through 72), this results in a total of eight data input multiplexors. Each data source has its own input on every multiplexor on a given side. A side, or port grouping, is a collection of one port from each of the four slices, 35 through 38 inclusive. Data coming out of each multiplexor (mux) is registered in preparation for writing into array 8. Error correction code (ECC) on each 144-bit line is checked as it enters the RAM associated with each slice and any errors detected are handled by the error logic that is separate from the data path as shown in FIG. 1.

Additionally, a path from each individual memory array, 22 through 29 inclusive, can bypass storage and be directed into DOG 4 output stream designated for the front side processor bus (PIB) 46. This path is used in some cases in the preferred embodiment to reduce the latency for memory accesses requested by a processor.

Table 1 provides a list of input sources to CDB 6, showing abbreviations used in this disclosure including the various figures along with a description and the RAM port multiplexor input designation. In the preferred embodiment of the present invention, the system is used with a data bus which is comprised of a proprietary design utilized by the Intel brand of microprocessors and associated microprocessor chip sets which are known commonly as an Intel F 16 bus (FIB) 47. Chip sets utilizing the F 16 bus data protocol are both popular in their application and well known to those skilled in the art. The FIB data source description in Table 1 refers to data output from such a source used in the preferred embodiment of the present invention.

TABLE 1

| Source | Description | RAM Port, Mux Input |
|---|---|---|
| MIBA 42 | First memory array input | A0 |
| MIBB 43 | Second memory array input | A1 |
| VIB 44 | The interface to the crossbar(s) | A2 |
| CSR 45 | Control/Status registers, diagnostics | A3 |
| PIB 46 | The front side bus | B0 |
| FIB 47 | The Intel/brand F16 interface | B1 |
| RMW 48 | Partial write merge logic | B2 |

The two memory array inputs are assigned to the same multiplexor so that write inhibit logic described below is not required to be duplicated The multiplexor select control signals and RAM write port addresses are given out of registers so that data is lined up correctly with the control. This provides the RAM arrays nearly a full system clock cycle to cleanly store each 144-bit word of data being provided.

FIG. 3 illustrates the details of the logic architecture of the CDB memory array 8. Each group of individual memory arrays that comprises one slice, being slice number 0, 1, 2 and 3 is depicted as slice 35, 36, 37 or 38 in the referenced figure. In FIG. 3, four input multiplexors 17 and 18 are shown with the corresponding data inputs or data channels used to supply data to each of the slices in CDB array 8. It can be appreciated that the multiplexors and the corresponding data input channels to the multiplexors shown are illustrated as an example only for slice 36, for clarity of presentation. Each multiplexor and input connection shown in FIG. 3 would be replicated for each slice, 35 through 38 inclusive.

Multiplexor 17 feeds the register array side 12 (also referred to as side A) as shown in FIG. 2, while multiplexor 18 would feed the register array inputs on side 13, (also known as side B) as is illustrated. The input signals provided as data from the memory interface block are introduced through channel 42 and channel 43 shown attached to multiplexor 17 in FIG. 3. A cross bar interface 44 and control and status register input 45 is also fed into multiplexor 17. Data from the front side bus, or PIB 46 is shown as one input on multiplexor 18. PIB 46 is that data bus from the computer processor used in the system being served by the preferred embodiment. Likewise, the PCI interface, or the F 16 interface bus (FIB) 47 is channeled to multiplexor 18. Finally, an input for request memory write 48 (RMW) is also channeled to multiplexor 18.

As can be seen in FIG. 3, requests for all CDB 6 data sources are fed to input control 9. Input control 9 consists of a simple "state machine" that drives the multiplexor select inputs on the RAM write address multiplexor for each of the eight RAM write ports. The same state machine also controls each data selection multiplexor.

CDB input control 9 also directs the flow of data from the data sources into CDB 6. CDB input control 9 is a modulo four counter that sequentially selects each input source for transfer into one of the CDB 6 SRAM ports. During any given system clock cycle, all eight SRAM write ports are connected to an input source one-to-one mapping.

It should be appreciated from FIG. 3 that the actual inputs to the input control 9 are in two groups of four, corresponding to the two SRAM write ports on each of the four slices, 35–38. On each system clock cycle, each input source is advanced to the next slice's input port. The corresponding 6-bit TrID from each data source module is also fed to the next write port address register so that the TrID matches the input source, except when an actual write is taking place. When a transfer first starts from a given source, the desired TrID is saved in the first RAM address register. During the write cycles following, the destination TrID is taken from the previous slice's write port address register.

The above-described process of sequentially selected slices continues regardless of whether valid data is present from each of the sources. On each system clock cycle, the next slice is selected. After four clock cycles, any given data source has returned to the same 144-bit slice where that source started in the sequence described above. The actual slice in which the first 144-bit line of a data transfer is saved is not important as long as the same slice is the first to be read when the line of data is sent on to its destination point.

Figure 4:
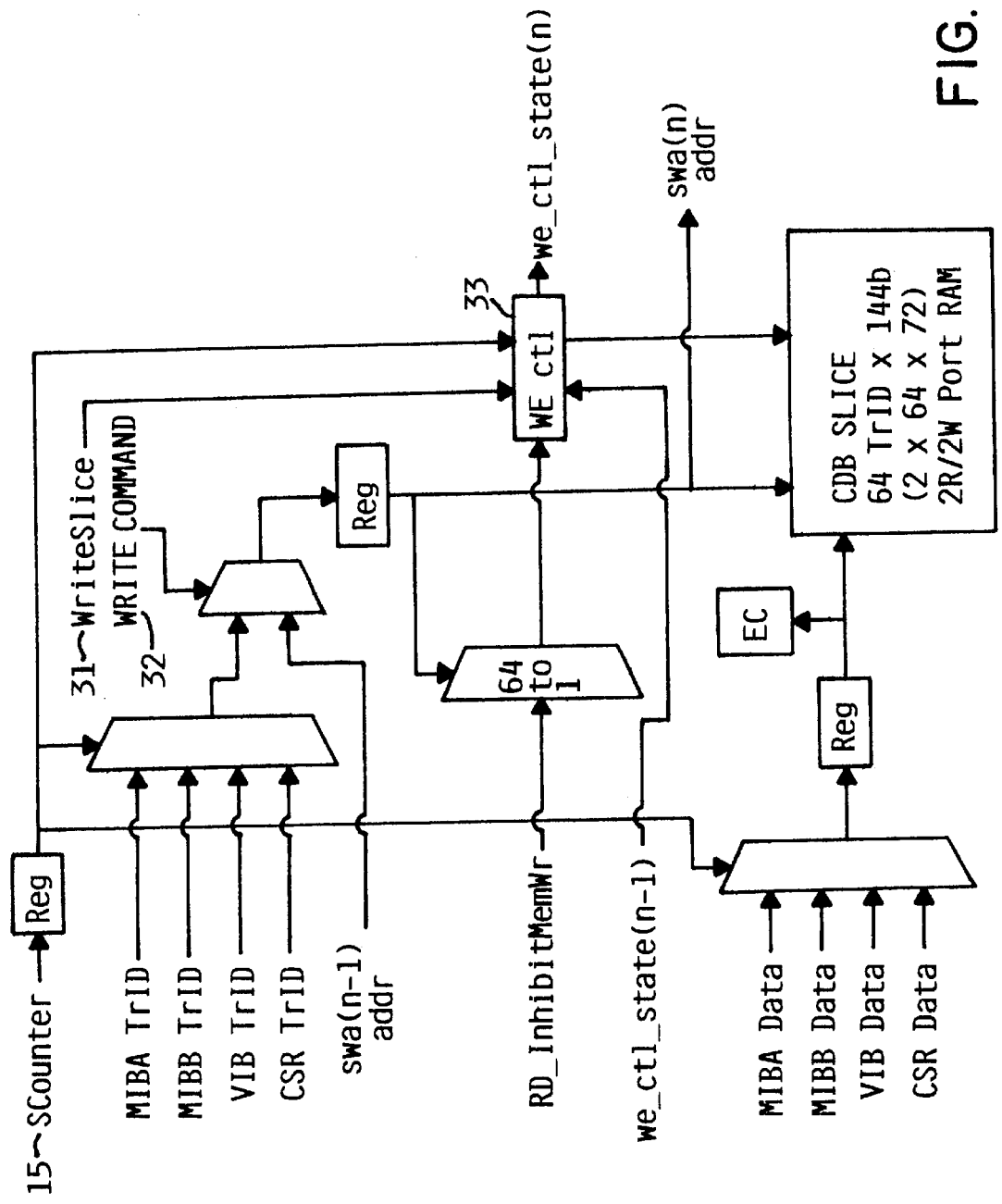
FIG. 4 is a functional block diagram providing detail of the input logic to each memory array slice in accordance with the present invention.

Turning to FIG. 4, shown is a simplified block diagram illustrating the input for one of two RAM write ports of a given one of the four slices 35–38. A two-bit counter (Scount) 15 feeds the multiplexor inputs at the entrance of the CDB 6. The value simply decrements on each clock cycle. The same counter value is used for both ports on a given slice. The value of the counter given to the next slice is one greater than the previous slice. The result of this process is that incoming 144-bit words from a given interface in the computer system are placed sequentially into increasingly higher numbered slices. Write slice 31 and write command 32 are under the control of the CDB input control module 9, shown on FIG. 3 and described below. As the first 144-bit word arrives from a data source within the system, write command 32 steers the TrID into a register so that it can be used on the next cycle as the address of the correct data storage location. At the same time, write slice 31 primes a write enable generator 33 as described below.

The ability of CDB 6 to take data at full speed from any or all of the system interfaces providing data, simultaneously, is due to the fact that each data source is always connected to one and only one storage slice. With every clock cycle of the system, each input is moved to the next slice in the sequence. Table 2 describes the clock sequencing involved in the operation of the system. When each slice has been seen by a given input, counter 15 driving the multiplexor select input wraps around and the sequence repeats after time t4 as shown in Table 2.

TABLE 2

| | Connected to slice input port at time: | | | | |
|---|---|---|---|---|---|
| Input | t0 | t1 | t2 | t3 | t4 |
| MIBA | S0A | S1A | S2A | S3A | S0A |
| MIBB | S1A | S2A | S3A | S0A | S1A |
| VIB | S2A | S3A | S0A | S1A | S2A |
| CSR | S3A | S0A | S1A | S2A | S3A |
| PIB | S0B | S1B | S2B | S3B | S0B |
| FIB | S1B | S2B | S3B | S0B | S1B |
| RMW | S2B | S3B | S0B | S1B | S2B |
| none | S3B | S0B | S1B | S2B | S3B |

Since every input to CDB 6 has exclusive use of a given slice at any given point in time, it is always assured of having some place to put incoming data without delay. The sequencing of the inputs to various slices runs continuously, even if valid data is not actually coming from any of the sources 42–48. The ability to take data from any source at any time does not come without a system performance cost.

One skilled in the art will appreciate that the first 144-bit word of data arriving from an input stream is not likely to be stored in slice 0, shown at 35. There is only a 25% chance that a given 144-bit word from an input stream will end up in the first slice 35. In the operation of the present system, even though the starting point is arbitrary, the inbound 144-bit words are always stored in sequential slices. Part of the procedure of storing data in CDB 6 involves saving the number of the slice to which the first 144-bit word is written Such information is stored in DOG 4 control storage area described below, and is instrumental in the retrieval process when data leaves CDB 6.

The described method allows up to eight data sources to simultaneously store 144-bit words into CDB 6 at the same time. With eight or less data inputs, each data source always has its own input to one of the four slices, 35–38, permitting reception of input data with low latency and no flow control.

Figure 8A:
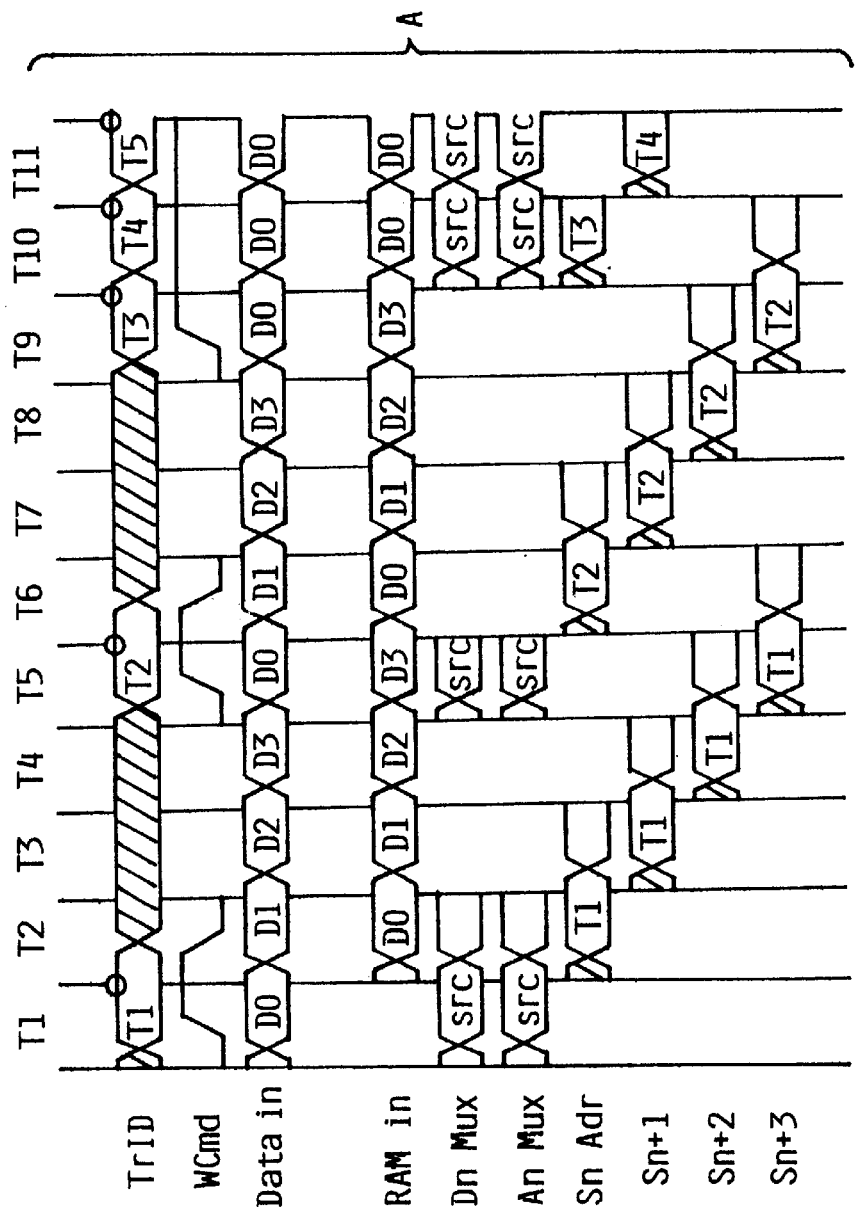
FIGS. 8A and 8B are a logic timing diagram demonstrating the data flow sequence input to the register arrays used in the present invention.
Figure 8B:
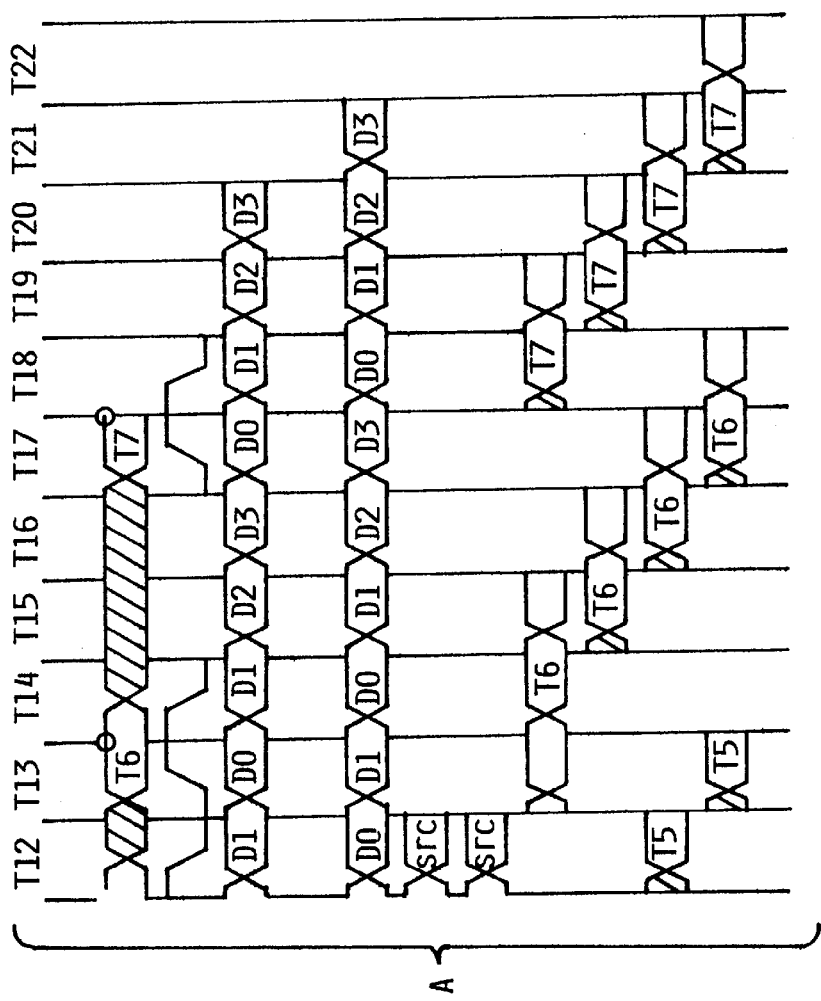

Examples of request and data timing are shown in FIG. 8 (presented in two parts as FIGS. 8A and 8B for clarity, but representing one diagram). A "TrID Valid" or "Command Valid" is asserted by a data source as the TrID and first 144-bit word of valid data is presented to CDB 6. Additional data follows on each of the following cycles until all of the data has been transferred.

Except for data to CDB 6 arriving from a command and status register (CSR) block (not shown), valid ECC bits must be provided by the input sources if the data is to be stored in CDB 6 for later retrieval. When the first 144-bit word of data is transferred, the starting slice, 35, 36, 37, or 38, is saved in the CSR array (not shown). The information regarding the slice location of the first 144-bit word is required for reading the data out of CDB 6 in the same order it was written. The slice number is stored in the same clock cycle as the first 144-bit word enters register array 8. Once this value is written into the control storage area, a transfer may be initiated to read data out of the location. A data destination does not have to wait for all of the 144-bit words for a transaction to be written.

Write command 32 shown in FIG. 4 for each slice input port is generated by one of two state machines, one for the A-side 12 and another for the B-side 13 of the register arrays. These machines monitor requests to store data from each of the sources on its side. The slice selected to start a transfer is based solely on the value of Scount 15. These machines also generate the initial "WriteSlice" 31 which is directed into the write-enable control machine present for each RAM port. After an example sequence completes, the data stored in CDB 6 resembles that shown in Table 3, which provides an example of data stored in each slice of register array 8. "dyz" denotes data 144-bit word "z" of transfer "y". "x" is a location that was not written.

TABLE 3

| Slice TrID | S0 | S1 | S2 | S3 |
|---|---|---|---|---|
| T0 | d00 | d01 | d02 | d03 |
| T1 | d11 | d12 | d13 | d10 |
| T2 | d21 | d22 | d23 | d20 |
| T3 | d32 | d33 | d30 | d31 |
| T4 | d40 | d41 | d42 | d43 |
| T5 | d51 | d52 | d53 | d50 |
| T6 | d62 | d63 | d60 | d61 |
| T7 | d70 | d71 | d72 | d73 |
| T8 | d80 | x | x | x |
| T9 | x | d90 | x | x |
| T10 | dA0 | dA1 | dA2 | dA3 |
| T11 | x | x | dB0 | x |

Each SRAM write port has a controller that manages actual writing of data into the SRAM port. Once started, the modules pass a write pulse to the SRAM and to the next slice in line to be written as earlier described. The information being passed to the next slice is a pulse count from a "from MIB" flag. After a total of four slices have been written, the final controller terminates the operation. The write-enable control machine provides system clock-synchronized enables to the SRAM array depending upon the validity of the input data stream.

To summarize, when data shows up at CDB 6 along with its destination TrID, the write process proceeds as follows. The write enable to each RAM is registered so that it is in phase with data that is coming from the data source being handled. Data is handled alongside the RAM address information. Like the TrID, the write enable is propagated from slice to slice until all four slices have been covered. A full cache line is always written, even if not all of the data is valid, except when a transfer is aborted.

Figure 5:
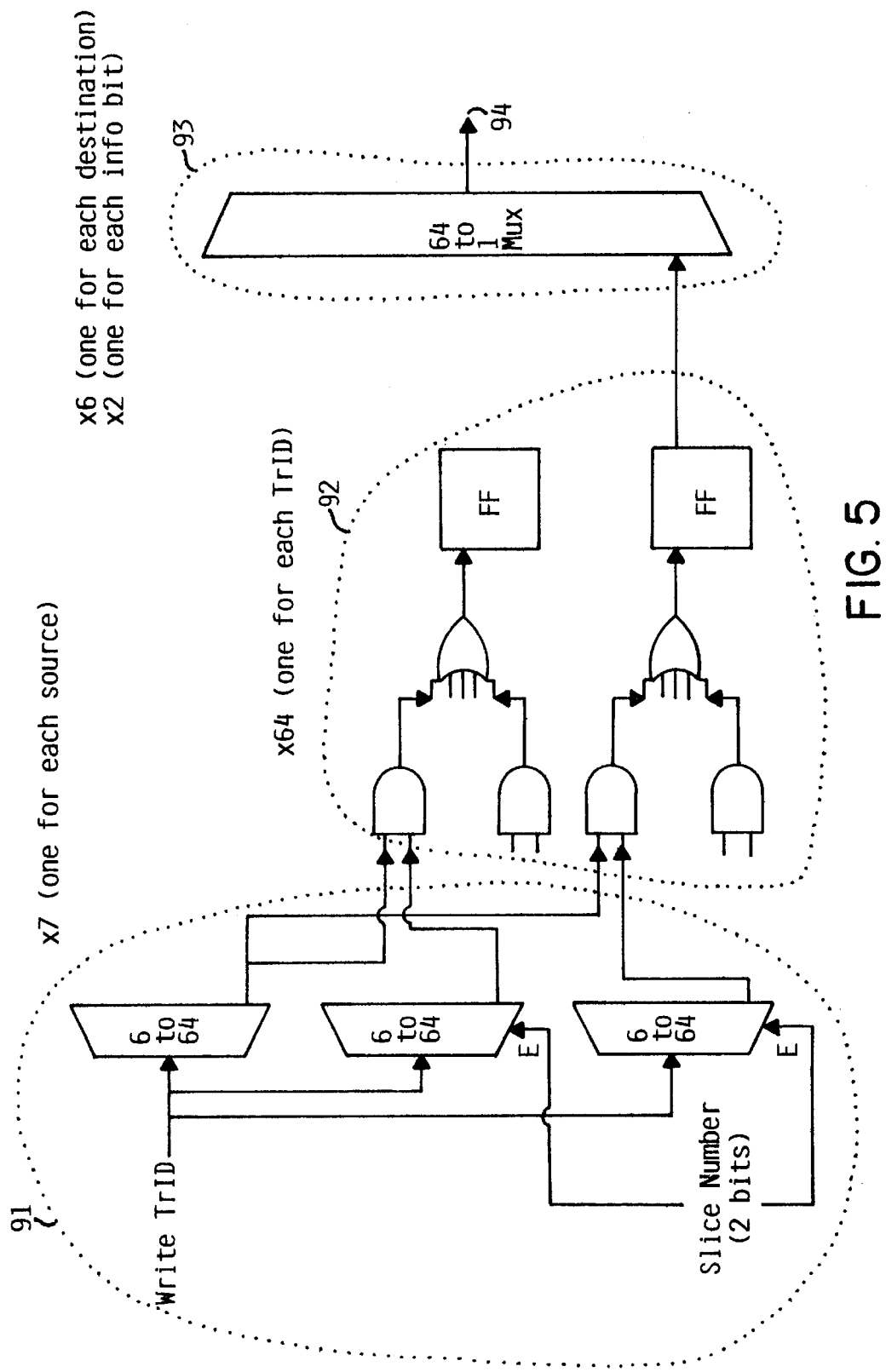
FIG. 5 is a block diagram of one input control means proving auxiliary storage for the starting slice identification used in the present invention.

DOG 4 must remember the starting slice for all lines of data stored within CDB 6. DOG 4 also keeps track of several address bits and the number of 144-bit words within register array 8 as shown specifically in FIG. 2. FIG. 5 discloses the structure of a portion of DOG 4 control storage area used to save the identification of the starting slice pointer.

FIG. 5 is a block diagram of one type of storage control means for proving auxiliary storage for the starting slice identification used in the present preferred embodiment. Many different types of storage circuits may be used to store such information. DOG 4 remembers the starting slice for all lines stored within the CDB 6. DOG 4 also keeps track of several address bits and the number of 144-bit wide words. To accomplish this, an array of 64 multi-bit registers, shown at 91 in FIG. 5, is provided that retains the information. Access is provided so that all CDB 6 inputs and outputs have the ability to store information and retrieve information simultaneously, thus creating a six read port and seven write port register file. The length and address information are thus stored.

A two-bit pointer to the slice in which a transfer starts is saved for each TrID line of storage. The actual loading of a given pointer takes place on the clock cycle edge when the first 144-bit wide word actually enters register array 8. The data paths of register array 8 are configured to provide all input and output ports with their own access to the information.

The number of 144-bit wide words which are valid for a given transfer into CDB 6 is stored in the storage control means shown in FIG. 5. The count is loaded into one of sixty-four registers, shown in one instance at 92, when the information is provided. Each of the sixty-four registers output their information to multiplexer 93 which combines the outputs from each register 92 to one output 94. The count of the number of 144-bit wide words is used by the output logic to control the end of data (EOD) signal that is passed to the destination and to determine when a destination output machine 58 can terminate a transfer by no longer requesting slice assignment.

Figure 6:
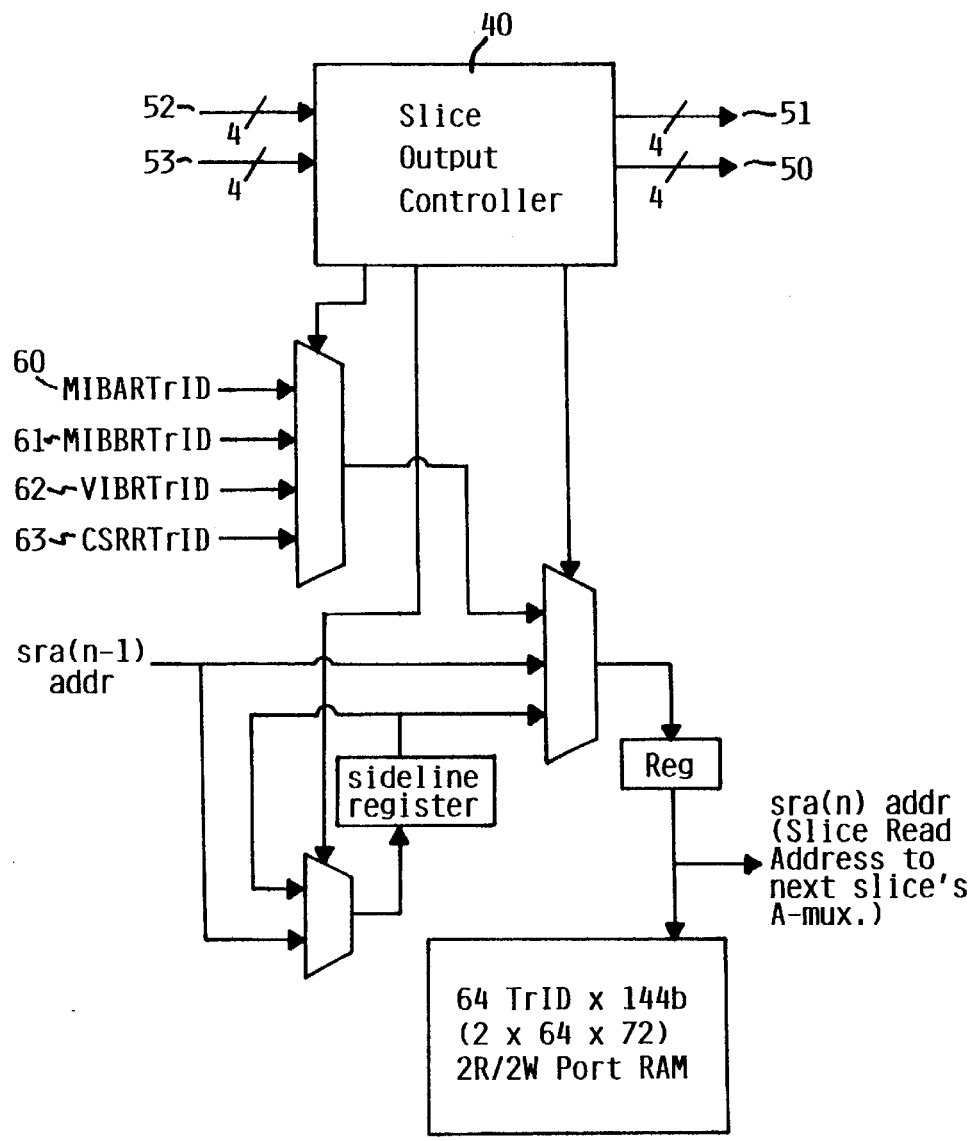
FIG. 6 is a block diagram of one of the four slice output control means used in the present invention.
Figure 7:
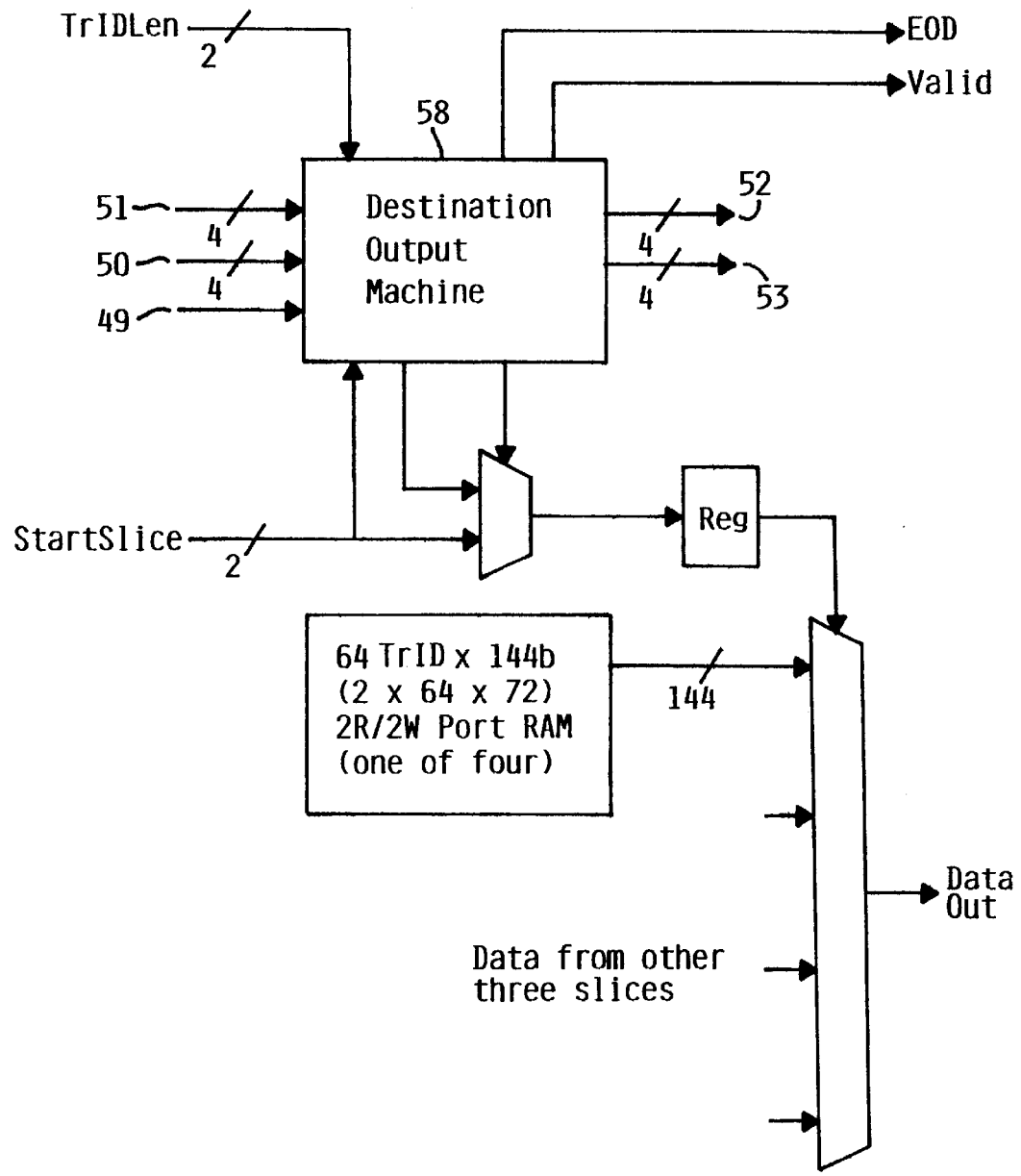
FIG. 7 is a block diagram of one of the four slice output control means used in the present invention.

Returning to FIG. 1, slice output controller 40 corresponds to the logic diagram shown in FIG. 6 for a single slice output machine 40. The output control logic consists of two different state machine modules. Each slice has a Slice Output Machine (SOM) 40 shown in FIG. 6, and each destination has a Destination Output Machine (DOM) 58 shown in FIG. 7. It would be appreciated by those skilled in the art that FIG. 6 and FIG. 7 is designed to illustrate the logic of one slice, but those connections with a diagonal slash therethrough in association with the number "4" depict four identical connections when considering the logic architecture for each slice. Utilizing the same schematic nomenclature, those connections illustrated in the figures with a diagonal slash therethrough, in association with the number "2", depict two identical connections when considering the logic architecture for each slice. Each DOM 58 is responsible for receiving the request for data and controlling the slice sequencing. Each SOM 40 handles addressing into the RAM array and handles any conflicts should more than one DOM 58 request the same slice. FIG. 6 shows a typical SOM 40 configuration for the A-side of a slice, shown for example at 12 in FIG. 2. The B-side, shown for example at 13 in FIG. 2, is similar, but with different input TrID sources. In FIG. 6, input 52 is an input request for new data to start while input 53 is an input signal requesting the next data. Output channel 51 denotes a sidelined output while output 50 indicates that the slice data should be granted to the requesting source.

Multiplexor input 60 is the MIBA request TrID. Input 61 is the MIBB request TrID. Input 62 represents the crossbar interface request TrID. Likewise, input 63 represents CSR 45 requests TrID. FIG. 7 shows the interconnection of a typical DOM 58. Four groups of signals each with up to four lines, one for each slice or destination controller, are used to communicate between the machines. Input 52, input 53, output 51, and output 50 provide the communication between DOM 58 and SOM 40. On Input 52, one destination request is reserved for defined high priority destination on each CDB output port. Each slice has a high priority input. To read a cache line out of CDB 6, the destination module places the TrID and asserts a Read Command (ReadCmd) 49 on the DOG 4 interface associated with the destination's DOM. DOM 58 then looks up the starting slice and length in the CDB control storage area and asserts New Start signal 52 into the appropriate SOM 40. The DOM 58 also directs the staring slice number into the output multiplexor control register and then waits for signal 50 from the corresponding slice controller. SOM 40 (one for each slice output port) receives access requests from each output machine on one of two signal groupings, either New Start signal 52 for transactions just starting, or signal 53 for transactions in process. New Start signal 52 or any slice is special, as suggested above, in that the destination requesting service on this line will always be granted access on the next clock regardless of any other requests, and accordingly is a priority. Depending upon the usage of the slice's output, either signal 50 or signal 51 is asserted back to the requesting DOM 58. Based upon which destination has been granted access to the slice for the next clock period, SOM 40 selects the correct TrID to be directed to the slice read port address register. If necessary, the TrID that is active on the preceding slice can be directed into the holding register ("output TrID sidelining").

Figure 9:
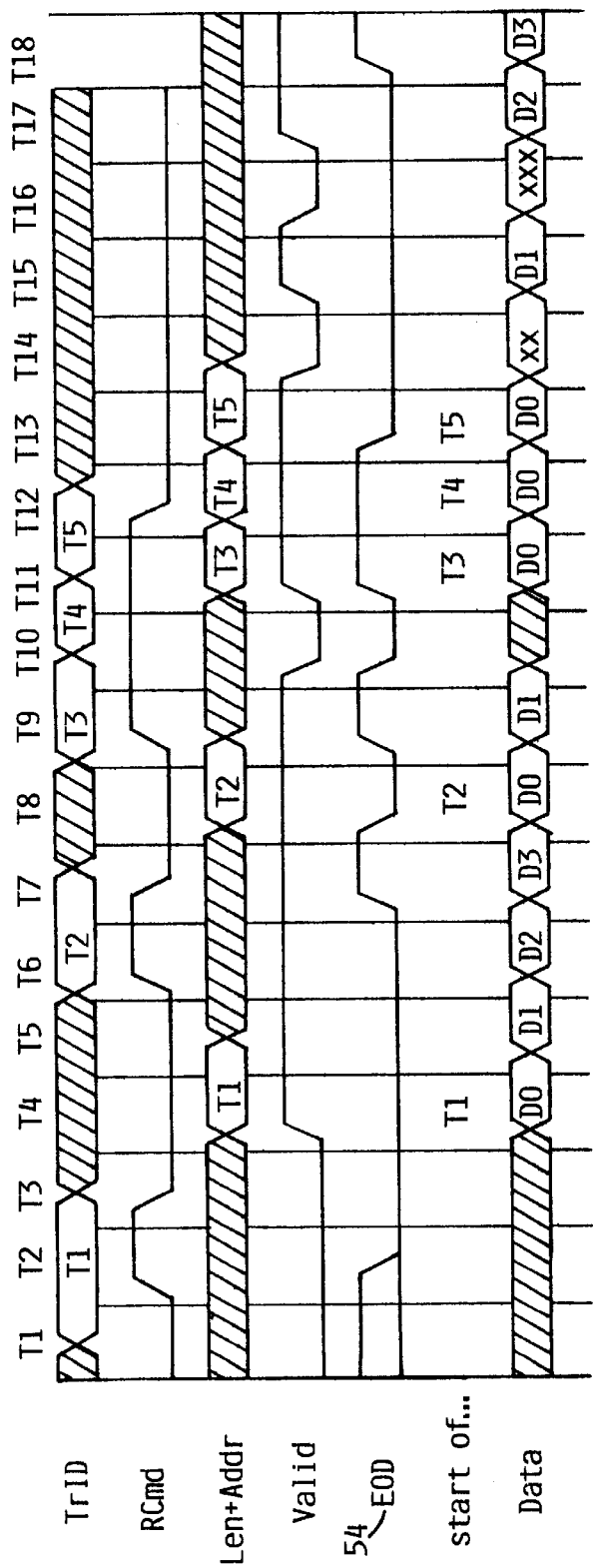
FIG. 9 is a logic timing diagram demonstrating the data flow sequence output from the register arrays used in the present invention.

As discussed earlier, FIG. 8 is the logic timing diagram representing the input to CDB array 8 as an example. FIG. 9 is a logic timing diagram representing the output of CDB array 8 as an example. In FIG. 9, line 54 represents an end of data (EOD) signal which denotes the last item of a cache line if a particular transfer is less than four fill words of 144 bits each. As described above and illustrated in FIG. 2, each array slice has two independent read ports and both ports on all four slices can be in use at the same time. This gives a total of up to eight simultaneous output streams, though the preferred embodiment disclosed only utilizes six output streams. The first 144-bit word for any given TrID may reside in any of the slices, therefore it may not be possible to deliver the data for different TrIDs that happen to have the same starting slice at exactly the same time. This will happen whenever the two destinations are on the same RAM port. Table 4 shows the output port multiplexor assignments.

TABLE 4

| Destination | Description | RAM Port, Mux Input |
| --- | --- | --- |
| VIB 44 | Data crossbar interface | A0 (high priority) |
| MIB 41 | Memory write data buffer | A1 |
| CSR 45 | Control/status registers | A2 |
| PIB 46 | Front side bus | B0 (high priority) |
| FIB 47 | F16 interface | B1 |
| RMW 48 | DOG merge buffer | B2 |

Like the CDB input illustrated in FIG. 4, multiplexors feed registers that in turn drive the RAM read address and mux select lines. To push a single TrID sequentially through the slices, the multiplexor directs the previous stage RAM address to the address register. A six-bit register for each RAM port is available to save the TrID in the event that an output slice is preempted for the high priority output. Data output multiplexors, one per destination, select the appropriate slice from which to read the 144 bit word. Data is registered upon leaving the destination multiplexor so that setup times to the destination's inputs can be met ECC is checked at the register outputs as illustrated in FIG. 1 and errors are flagged, but not corrected except on the path to the merge buffer 10.

Although the preferred embodiment has been described with particular examples that are used to illustrate carrying out the principles of the invention, it would be appreciated by those skilled in the art that other variations or adaptations of the principal disclosed herein, could be adopted using the same ideas taught herewith. In particular, the term "multiplexor" is used herein to refer to any circuit capable of combining signals from multiple input sources into a single output signal. Further, while described as embodied in a computer system, the invention is equally useful and advantageous in any data handling apparatus, including but not limited to communications routers and switches. Such applications and principals are considered to be within the scope and spirit of the invention disclosed and are otherwise described in the appended claims.

We claim:

1. A system for handling data for data processing means utilizing a plurality of memory registers comprising:
    a first multiplexor means for receiving data from said processing means coupled to said plurality of memory registers;
    a second multiplexor means for outputting data from a memory means coupled to said plurality of memory registers;
    a plurality of registers configured into slices of arrays, each slice having two independent inputs coupled to said first multiplexor means to receive data input from said first multiplexor means and each slice having two independent outputs to convey data to said second multiplexor means;
means to track the identification and location of data being stored to said plurality of memory registers from said first multiplexor means;
    means to select identified data within said plurality of memory registers for output to said second multiplexor means.

2. The system of claim 1 further including means to forward said identified data to a requested destination within said processing means.

3. The system of claim 1 wherein said first multiplexor means comprises eight ports coupled to said plurality of memory registers.

4. The system of claim 1 wherein said second multiplexor means comprises eight ports coupled to the output of said plurality of memory registers.

5. The system of claim 1 wherein said first multiplexor means comprises a four to one multiplexor.

6. The system of claim 5 wherein said second multiplexor means comprises a one to four multiplexor.

7. The system of claim 1 wherein further said plurality of registers are such that a memory access by the system can be overlapped with a data transfer.

8. The system of claim 1 wherein said plurality of registers is comprised of an array of eight separate 72 bit memory registers, configured into four slices, whereby each slice is comprised of two of said memory registers operatively connected to store 64 lines of four 144-bit data words in each said slice, each said memory registers having at least one input port.

9. A method of handling data between a central processing unit (CPU) and a data storage means in which the data storage means receives and stores a continuous flow of data items being processed in the CPU in which data items are received from multiple sources simultaneously comprised of a plurality of memory registers configured into an array of four slices of memory, each slice having two input ports coupled to an input multiplexor means and two output ports coupled to an output multiplexor means, the method comprising the steps of:
    providing data words from said CPU to a first multiplexor interface means coupled to said CPU and said memory;
    identifying and tracking each said data word;
    storing said data words sequentially in each slice of memory and storing the location and identification of each data word stored;
    outputting said data words to a destination requested by said CPU by identifying and selecting the slice containing the start of the requested data and sequentially reading the data words requested.

10. A method of handling data between a central processing unit (CPU) and a data storage means in which the data storage means receives and stores a continuous flow of data items being processed in the CPU in which data items are received from multiple sources simultaneously comprised of a plurality of memory registers configured into an array of four slices of memory, each slice having two input ports coupled to an input multiplexor means and two output ports coupled to an output multiplexor means, the method comprising the steps of:
    a. looking up data requested by the CPU in an auxiliary storage register which stores data location;
    b. selecting the resulting data slice;
    c. conveying said data slice to the destination requesting said slice based on a predetermined output order;
    d. conveying said slice to the requested destination; and
    e. continuing the steps of c and d until such requests are fulfilled.

11. The method of claim 10 wherein further if multiple destinations request the same data slice, the conveyance of said data slice to the requested destination is in the order of:
    designated high priority output slices;
    previously held pre-empted data transfers of said data slices;
    then previous data slices in accordance with (n−1) wherein n equals the previously preempted slice until all previously preempted slices are conveyed; and
    any new data transfer request selected from multiple requests for data from said CPU.

12. A method of increasing data handling speed in a computer memory system utilizing random access memory arrays arranged in at least two slices of memory registers handling data from multiple input sources or output destinations comprising the steps of:
    providing data from the computer system processor to a multiplexor means coupled to said processor and said random access memory arrays, wherein said multiplexor means continuously selects said memory registers sequentially;
    sequentially storing data from said first multiplexor means beginning at any data storage line within any said slice;
    identifying the location of the first said storage line of data in each said slice and storing such location information;
    outputting data from said memory registers when requested to a destination by reading the location of the starting slice of the requested data and reading such data sequentially beginning at said starting slice.

13. Apparatus for handling data in a data processing system, comprising:
- first and second memories, each having an input for writing data and an output for reading the data;
- a first input multiplexor having multiple system inputs for receiving the data, and an output coupled to the input of the first memory;
- a second input multiplexor having multiple system inputs for receiving the data simultaneously with the first input multiplexor receiving the data, and an output coupled to the input of the second memory;
- an output multiplexor having inputs coupled to the outputs of the first and second memories;
- an input controller including identification and location of the data in the first and second memories; and
- an output controller responsive to the identification and location of the data, and coupled to the output multiplexor.

14. The apparatus of claim 13 wherein the data received by the first input multiplexor does not equal that of the second input multiplexor.

15. The apparatus of claim 13 wherein the first and second memories each have second inputs.

16. The apparatus of claim 15 further including third and fourth input multiplexors, each having multiple system inputs for receiving second data, an output of the third input multiplexor being coupled the second input of the first memory, and an output of the fourth input multiplexor being coupled the second input of the second memory.

17. The apparatus of claim 16 wherein the second data is not equal to the data of first and second multiplexor.

18. The apparatus of claim 13 wherein the first and second memories each have second outputs.

19. The apparatus of claim 18 further including a second output multiplexor having inputs coupled to the second outputs of the first and second memories.

20. The apparatus of claim 19 wherein the second output multiplexor is active simultaneously with the first output multiplexor.

21. The apparatus of claim 13 wherein the first output multiplexor has an output coupled to a first system output, and further including a second output multiplexor having inputs coupled to the outputs of the first and second memories and an output coupled to a second system output.

22. The apparatus of claim 13 further including third and fourth memories.

23. The apparatus of claim 13 further including additional memories, wherein the number of memories is equal to the number of words in a unit of storage of the data.

24. The apparatus of claim 13 wherein each of the first and second memories comprises two or more memory elements, each memory element storing less than an entire word of each unit of storage of the data.

* * * * *